(12) United States Patent
Hara et al.

(10) Patent No.: US 8,653,908 B2
(45) Date of Patent: Feb. 18, 2014

(54) FILM BULK ACOUSTIC RESONATOR, FILTER, COMMUNICATION MODULE AND COMMUNICATION APPARATUS

(75) Inventors: Motoaki Hara, Tokyo (JP); Tokihiro Nishihara, Tokyo (JP); Shinji Taniguchi, Tokyo (JP); Takeshi Sakashita, Tokyo (JP); Tsuyoshi Yokoyama, Tokyo (JP); Masafumi Iwaki, Tokyo (JP); Masanori Ueda, Tokyo (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 579 days.

(21) Appl. No.: 12/921,150

(22) PCT Filed: Mar. 4, 2008

(86) PCT No.: PCT/JP2008/053828
§ 371 (c)(1),
(2), (4) Date: Sep. 3, 2010

(87) PCT Pub. No.: WO2009/110062
PCT Pub. Date: Sep. 11, 2009

(65) Prior Publication Data
US 2011/0006860 A1    Jan. 13, 2011

(51) Int. Cl.
*H03H 9/54*      (2006.01)
(52) U.S. Cl.
USPC .......................................... 333/187; 310/320
(58) Field of Classification Search
USPC .......... 333/133, 187–193, 202, 167; 310/320, 310/365
See application file for complete search history.

(56) References Cited

U.S. PATENT DOCUMENTS

| 4,642,508 A | 2/1987 | Suzuki et al. |
| 5,872,493 A | 2/1999 | Ella |

(Continued)

FOREIGN PATENT DOCUMENTS

| EP | 0155145 B1 | 3/1985 |
| JP | 60-189307 A | 9/1985 |

(Continued)

OTHER PUBLICATIONS

C.P. Moreira, A.A. Shirakawa, E. Kerherve, J.M. Pham, P. Jarry, D. Belot, P. Ancey, "Design of a Fully-Integrated BiCMOS/FBAR Reconfigurable RF Receiver Front-End", 18th Symposium on Integrated Circuits and Systems, Sep. 4-7, 2005, pp. 138-143.*

(Continued)

*Primary Examiner* — Benny Lee
*Assistant Examiner* — Rakesh Patel
(74) *Attorney, Agent, or Firm* — Chen Yoshimura LLP

(57) ABSTRACT

A piezoelectric thin film resonator of the present has a substrate 1, an intermediate layer 7 disposed on the substrate 1 and is formed of an insulator, a lower electrode 3 disposed on the intermediate layer 7, a piezoelectric film 4 disposed on the lower electrode 3, and an upper electrode 5 disposed on a position facing the lower electrode 3 with the piezoelectric film 4 interposed therebetween, in which, in a resonant region 8 where the lower electrode 3 and the upper electrode 5 face each other, a space 6 is formed in the substrate 1 and the intermediate layer 7 or between the lower electrode 3 and the intermediate layer 7 and the region of the space 6 is included in the resonant region 8. With the structure, the dissipation of the vibrational energy to the substrate from the resonance portion can be suppressed, thereby improving the quality factor.

11 Claims, 14 Drawing Sheets

(56) References Cited

U.S. PATENT DOCUMENTS

| | | | |
|---|---|---|---|
| 6,384,697 | B1 | 5/2002 | Ruby |
| RE42,009 | E | 12/2010 | Nakatsuka et al. |
| 2005/0046519 | A1 | 3/2005 | Yokoyama et al. |
| 2005/0057117 | A1 | 3/2005 | Nakatsuka et al. |
| 2005/0099092 | A1 | 5/2005 | Nakamura et al. |
| 2005/0237132 | A1* | 10/2005 | Sano et al. .................. 333/189 |
| 2005/0248238 | A1 | 11/2005 | Yamada et al. |
| 2006/0091764 | A1 | 5/2006 | Tsutsumi et al. |

FOREIGN PATENT DOCUMENTS

| | | | |
|---|---|---|---|
| JP | H10-270979 | A | 10/1998 |
| JP | 2002-140075 | A | 5/2002 |
| JP | 2005-73175 | A | 3/2005 |
| JP | 2005-117641 | A | 4/2005 |
| JP | 2005-160056 | A | 6/2005 |
| JP | 2005-236338 | A | 9/2005 |
| JP | 2005-318562 | A | 11/2005 |
| JP | 2006-128993 | A | 5/2006 |
| JP | 2006-229611 | A | 8/2006 |
| JP | 2008-48040 | A | 2/2008 |
| WO | 04/001964 | A1 | 12/2003 |

OTHER PUBLICATIONS

D. McNamara, "FBAR Technology Shrinks CDMA Handset Duplexers", Microwaves & RF, Sep. 2000, pp. 71-79.*

R. Johnson, Characterization of piezoelectric ZnO thin films and the fabrication of piezoelectric microcantilevers, Masters Thesis, Iowa State University, Jul. 20, 2005.*

Shimizu et al., "ZnO/SiO2—Diaphragm Composite Resonator on a Silicon Wafer", Electron. Lett., Jul. 9, 1981, vol. 17, pp. 507 to 509, downloaded on Dec. 2, 2010 from http://www.ietdl.org/EL Mentioned on pp. 4, 6 and 11of as-filed specification.

International Search Report (ISR) issued in PCT/JP2008/053828 (parent application) mailed in Jun. 2008 for Examiner consideration.

Written Opinion (PCT/ISA/237) issued in PCT/JP20081053828 (parent application) mailed in Jun. 2008.

Japanese Office Action issued on Jun. 8, 2012, in a counterpart Japanese patent application No. 2010-501707.

Response (including the amendment and the remarks) submitted on Aug. 7, 2012, to the Office Action listed Non-Patent Literature document No. 1 above.

Japanese Office Action issued on Aug. 27, 2012, in a counterpart Japanese patent application No. 2010-501707.

Response (including the remarks) submitted on Oct. 23, 2012, to the Office Action listed Non-Patent Literature document No. 3 above.

* cited by examiner

FILM BULK ACOUSTIC RESONATOR, FILTER, COMMUNICATION MODULE AND COMMUNICATION APPARATUS

TECHNICAL FIELD

The present invention relates to a piezoelectric thin film resonator. In particular, the invention relates to a piezoelectric thin film resonator having a space under a resonance portion in which an upper electrode and a lower electrode face each other with a piezoelectric film interposed therebetween, and a filter, a communication module, and a communication apparatus provided with such piezoelectric thin film resonator.

BACKGROUND ART

With the rapid spread of wireless devices typified by cellular phones, small and lightweight resonators and filters made by combining such resonators have been increasingly demanded. Until now, dielectrics and surface acoustic wave (SAW) filters have been mainly used. Hitherto, in recent years, a piezoelectric thin film resonator which is an element in which the characteristics particularly in high frequencies are excellent and which can be reduced in the size and structured into a monolithic, and a filter using such piezoelectric thin film resonator have increasingly attracted attention.

As one of such piezoelectric thin film resonators, a FBAR (Film Bulk Acoustic Resonator) type resonator is known. The FBAR has a multilayered structure (composite film) of an upper electrode, a piezoelectric film, and a lower electrode on a substrate and has a via hole or a cavity (space) in order to prevent the dissipation of vibrational energy to the substrate under the lower electrode in a portion where the upper electrode and the lower electrode face each other. In some cases, a space is formed under the lower electrode through a dielectric film. The via hole can be formed by etching, for example, an Si substrate to be used as an element substrate from the back surface. The cavity can be formed by forming a resonator, such as a composite film, on a sacrificial layer pattern on the substrate surface, and finally removing the sacrificial layer. In the following description, the piezoelectric thin film resonator having the via hole as a space is referred to as a "via hole type," whereas the piezoelectric thin film resonator having the cavity is referred to as a "cavity type".

In the piezoelectric thin film resonator configured as described above, when a high frequency electrical signal is applied between the upper electrode and the lower electrode, an elastic wave excited by converse piezoelectric effects or an elastic wave produced by distortion resulting from piezoelectric effects arises in the piezoelectric film interposed between the upper electrode and the lower electrode. The elastic waves are converted to electrical signals. Such elastic waves are converted to thickness longitudinal oscillation waves having the main displacement in the thickness direction because the waves are totally reflected on the surface where the upper electrode and the lower electrode each contact the air. With such element structure, resonance occurs at the frequency where the total film thickness H of the multilayered structure containing the upper electrode, the piezoelectric film, and the lower electrode formed on the space becomes equal to the integral multiple (n times) of the ½ wavelength of the elastic wave. The transmitting velocity V of the elastic wave is decided depending on materials, and the resonance frequency F is determined by:

$$F = nV/2H.$$

When such a resonance phenomenon is utilized, the resonance frequency can be controlled by using the film thickness as a parameter, and resonators or filters having desired frequency characteristics can be produced.

As the upper electrode and the lower electrode, metal materials, such as aluminum (Al), copper (Cu), molybdenum (Mo), tungsten (W), tantalum (Ta), platinum (Pt), ruthenium (Ru), rhodium (Rh), iridium (Ir), chromium (Cr), or titanium (Ti) or laminated materials containing a combination of such metals can be used.

As the piezoelectric film, aluminum nitride (AlN), zinc oxide (ZnO), lead zirconate titanate (PZT), lead titanate (PbTiO$_3$), etc., can be used. In particular, aluminum nitride (AlN) and zinc oxide (ZnO) having an orientation axis in the (002) direction during film formation are preferable for the piezoelectric film.

As the substrate, silicon (Si), glass, gallium arsenide (GaAs), and the like can be used.

FIG. 17 is a cross sectional view of a via hole type piezoelectric thin film resonator disclosed in Non-patent Document 1. As shown in FIG. 17, an Au—Cr film as a lower electrode 103, a ZnO film as a piezoelectric film 104, and a an Al film as an upper electrode 105 form a multilayered structure on an Si(100) substrate 101 having a thermal oxidation film (SiO$_2$) 102. Under the multilayered structure, a space (via hole) 106 is formed. The space 106 is formed from the back surface of the Si(100) substrate 101 using anisotropic etching using an aqueous KOH solution or an aqueous EDP solution (mixed liquid of ethylene diamine, pyrocatechol, and water).

FIG. 18 is a cross sectional view of a cavity type piezoelectric thin film resonator disclosed in Patent Document 1. As shown in FIG. 18, a multilayered structure containing a lower electrode 203, a piezoelectric film 204, and an upper electrode 205 is formed on a substrate 201 having a thermal oxidation film (SiO$_2$) 202. Under the multilayered structure, a space (cavity) 206 is formed. The space 206 can be formed by forming an island-shaped ZnO sacrificial layer pattern beforehand on the substrate 201, forming a multilayered structure on the sacrificial layer pattern, and then removing the sacrificial layer present under the multilayered structure with an etching liquid, such as acid.

In the piezoelectric thin film resonator, the orientation properties of the piezoelectric thin film are preferably uniform in order to obtain a high coupling coefficient in a resonance region where the lower electrode and the upper electrode face each other. However, the end of the lower electrode has a level difference or inclination, and thus the orientation properties of the piezoelectric thin film become discontinuous.

The discontinuous region of this piezoelectric film not only degrades the properties of the piezoelectric thin film resonator, but also has serious influence on the reliability.

In order to solve the above-described problems, the structure shown in FIGS. 19 and 20 is disclosed in Patent Document 3. FIG. 19 is a plan view of the piezoelectric thin film resonator disclosed in Patent Document 3. FIG. 20 is a cross sectional view of the Z-Z' region in FIG. 19. As shown in FIGS. 19 and 20, it is devised that, in a region 307 where a lower electrode 303 and an upper electrode 305 face each other, a discontinuous portion 308 of a piezoelectric film 304 generated due to the level difference at the end of the lower electrode described above is outside the region of a space 306, and the discontinuous portion 308 does not substantially function as a resonator.

[Patent Document 1] Japanese Unexamined Patent Application Publication No. 60-189307
[Patent Document 2] Japanese Unexamined Patent Application Publication No. 2006-128993
[Patent Document 3] Japanese Unexamined Patent Application Publication No. 2002-140075
[Non-patent Document 1] Electron. Lett., 1981, volume 17, pp. 507 to 509

DISCLOSURE OF INVENTION

Problems to be Solved by the Invention

In the resonator according to Patent Document 3, a portion 309 of the resonance region 307 is fixed to the substrate in the resonance region 307 where the upper electrode 305 and the lower electrode 303 face each other as shown in FIGS. 19 and 20. In such a structure, vibration generating in the resonance region 307 leaks to the substrate 301 side through the portion 309 of the resonance region 307, and thus the quality factor Q of the resonator sharply decreases.

It is an object of the present invention to provide a piezoelectric thin film resonator that can suppress the dissipation of vibrational energy to a substrate from a resonance region, a duplexer, a communication module, and a communication apparatus.

Means for Solving the Problems

A first piezoelectric thin film resonator of the invention has a substrate, an intermediate layer disposed on the substrate and formed of an insulator, a lower electrode disposed on the intermediate layer, a piezoelectric film disposed on the lower electrode, and an upper electrode disposed at a portion facing the lower electrode with the piezoelectric film interposed therebetween, in which, in a resonance region where the lower electrode and the upper electrode face each other, a space is formed in the substrate and the intermediate layer or between the lower electrode and the intermediate layer, and the region of the space is included in the resonance region.

A second piezoelectric thin film resonator of the invention has a substrate, an intermediate layer disposed on the substrate and formed of an insulator, a lower electrode disposed on the intermediate layer, a piezoelectric film disposed on the lower electrode, and an upper electrode disposed at a portion facing the lower electrode with the piezoelectric film interposed therebetween, in which, in a resonance region where the lower electrode and the upper electrode face each other, a space is formed in the substrate and the intermediate layer or between the lower electrode and the intermediate layer, the resonance region and the region of the space cross each other, and in the resonance region which is surrounded by the end of the upper electrode and the end of the lower electrode, all or part of an intermediate region that is a region of the resonance region excluding the region of the space is fixed to the intermediate layer.

Advantages

According to the present invention, the dissipation of the vibrational energy from the resonance portion can be suppressed, and thus a reduction in the quality factor Q can be prevented.

BEST MODES FOR CARRYING OUT THE INVENTION

Figure 1:
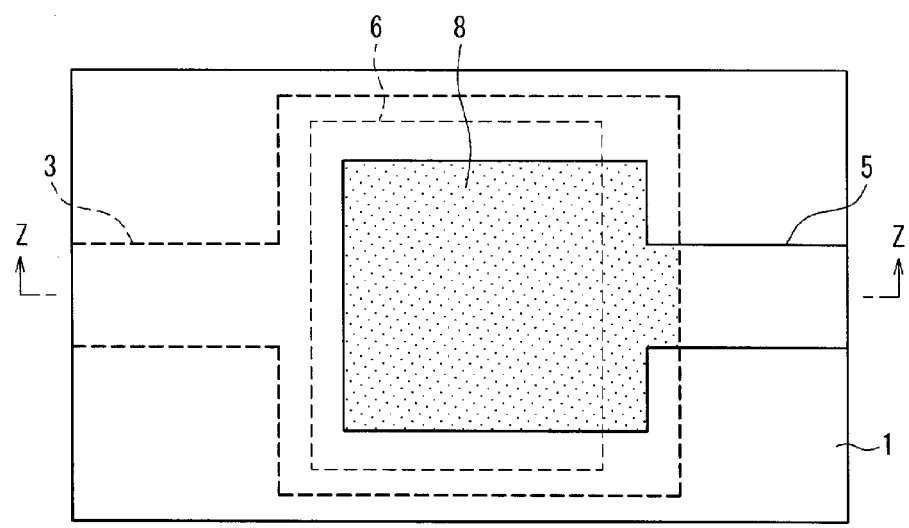
FIG. 1 is a plan view of a piezoelectric thin film resonator according to an embodiment.

A first piezoelectric thin film resonator of the invention has a substrate, an intermediate layer disposed on the substrate and formed of an insulator, a lower electrode disposed on the intermediate layer, a piezoelectric film disposed on the lower electrode, and an upper electrode disposed at a portion facing the lower electrode with the piezoelectric film interposed therebetween, in which, in a resonance region where the lower electrode and the upper electrode face each other, a space is formed in the substrate and the intermediate layer or between the lower electrode and the intermediate layer, and the region of the space is included in the resonance region. According to the present invention, the dissipation of the vibrational energy to the substrate from the resonance portion can be efficiently prevented using a simple manufacturing process.

A second piezoelectric thin film resonator of the invention has a substrate, an intermediate layer disposed on the substrate and formed of an insulator, a lower electrode disposed on the intermediate layer, a piezoelectric film disposed on the lower electrode, and an upper electrode disposed at a portion facing the lower electrode with the piezoelectric film interposed therebetween, in which, in a resonance region where the lower electrode and the upper electrode face each other, a space is formed in the substrate and the intermediate layer or between the lower electrode and the intermediate layer, resonance region and the region of the space cross each other, and in the resonance region which is surrounded by the end of the upper electrode and the end of the lower electrode, all or part of an intermediate region that is a region of the resonance region excluding the region of the space is fixed to the intermediate layer. According to the present invention, the dissipation of the vibrational energy to the substrate from the resonance portion can be efficiently prevented using a simple manufacturing process.

The piezoelectric thin film resonator of the present invention can take the following aspects on the basis of the structures above.

More specifically, in the piezoelectric thin film resonator of the invention, the film thickness of the intermediate layer can be structured to be 0.10 to 0.30 times the wavelength of an elastic wave which spreads in the thickness direction in the intermediate layer the structure at an anti-resonance frequency of the piezoelectric thin film resonator.

In the piezoelectric thin film resonator of the present invention, the intermediate layer can be formed of silicon oxide. When structured as described above, a piezoelectric thin film resonator having excellent resonance properties can be provided. In particular, by adjusting the thickness of a silicon oxide film to be 0.40 to 0.70 times that of the piezoelectric film, a piezoelectric thin film resonator having excellent resonance properties can be provided.

In the piezoelectric thin film resonator of the present invention, the piezoelectric film can be formed of an aluminum nitride or a zinc oxide having orientation properties in which the (002) direction is the principal axis. According to the structure, a piezoelectric thin film resonator having excellent resonance properties can be provided.

A filter of the present invention has the piezoelectric thin film resonator having the above-described structure. A communication module of the present invention has the filter having the above-described structure. A communication apparatus of the present invention has the communication module having the structure. Due to the structures, the dissipation of the vibrational energy from the resonance portion can be suppressed using a simple manufacturing process. Thus, the present invention can provide a high performed filter, a communication module, and a communication apparatus.

EMBODIMENTS

1. Structure of Piezoelectric Thin Film Resonator

Figure 2:
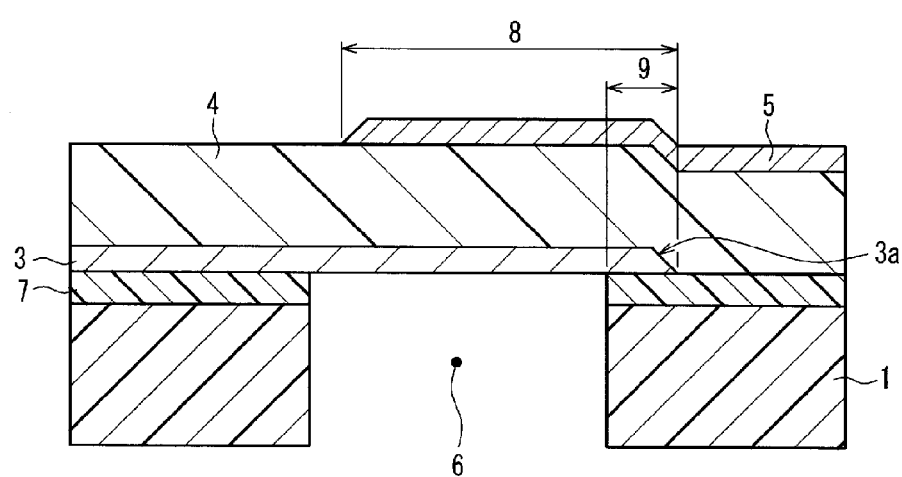
FIG. 2 is a cross sectional view of the Z-Z portion in FIG. 1.
Figure 3:
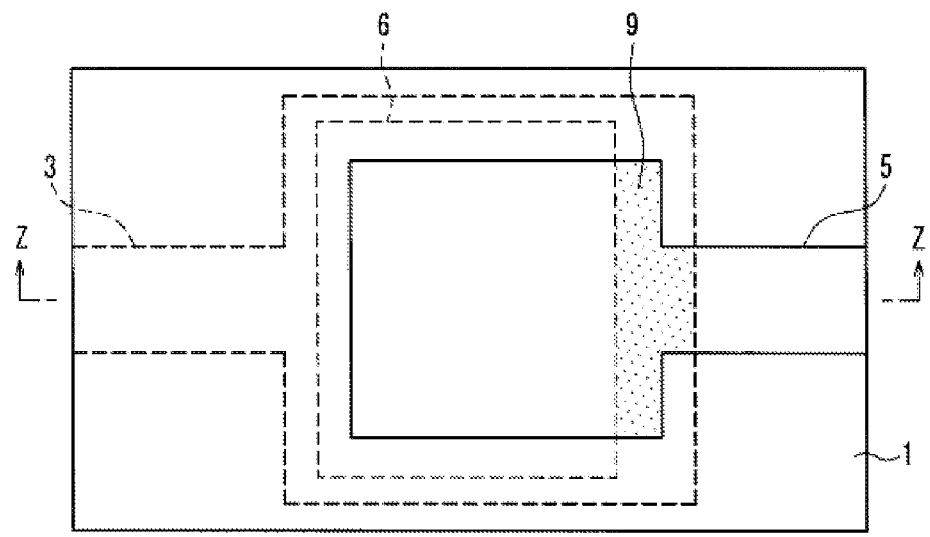
FIG. 3 is a plan view of a piezoelectric thin film resonator according to an embodiment.

FIG. 1 is a plan view of a piezoelectric thin film resonator according to this embodiment. FIG. 2 is a cross sectional view of the Z-Z portion in FIG. 1. As shown in FIGS. 1 and 2, the piezoelectric thin film resonator is formed by laminating a substrate 1 formed of, for example, silicon, a lower electrode 3, a piezoelectric film 4, and an upper electrode 5. The substrate 1 has a space 6. The lower electrode 3 is formed of ruthenium (Ru). The piezoelectric film 4 is formed of aluminum nitride (AlN). The upper electrode 5 is formed of Ru. A resonance portion 8 (resonance region) is a region where the lower electrode 3 and the upper electrode 5 face each other with the piezoelectric film 4 interposed therebetween. The resonance portion 8 in FIG. 1 is a region to which dot hatching is given. As shown in FIG. 3, an intermediate region 9 is a region in which the region of the space 6 is excluded from the resonance region 8. In the intermediate region 9, the lower electrode 3 is fixed to an intermediate layer 7. In FIG. 3, hatching is given only to the intermediate region 9 in the plan view shown in FIG. 1 in order to specify the position of the intermediate region 9. The thickness of the lower electrode 3 is about 250 nm, the thickness of the piezoelectric film 4 is about 1.2 μm, and the thickness of the upper electrode 5 is about 250 nm. The end 3a of the lower electrode 3 has an inclination angle of 30°.

Figure 4:
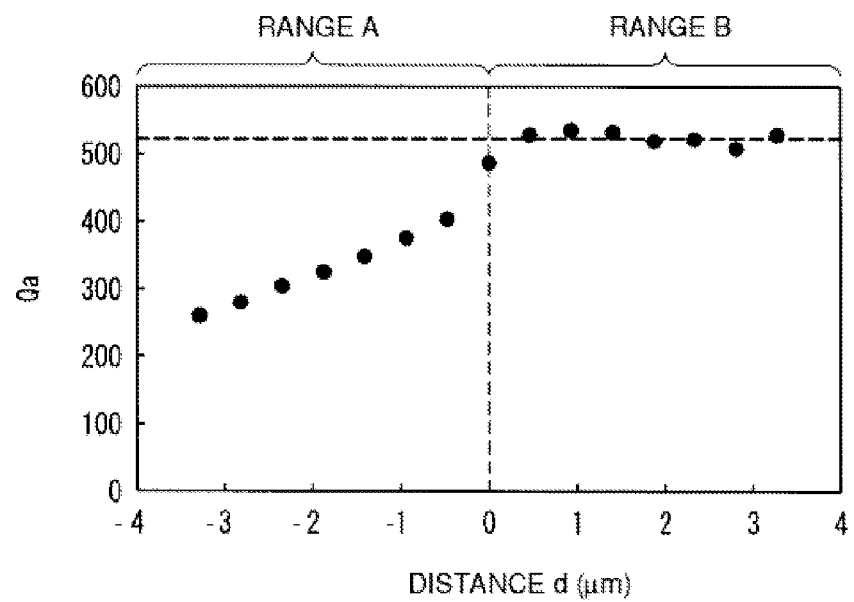
FIG. 4 is a characteristic chart showing the relationship between an intermediate region and the quality factor Q.
Figure 5A:
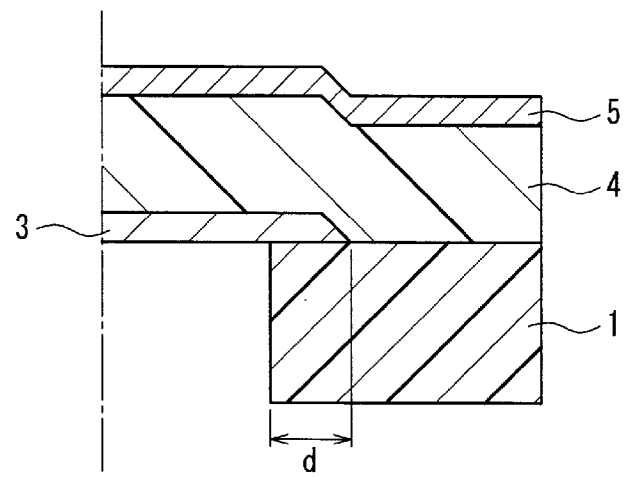
FIG. 5A is a cross sectional view of a principal portion of an intermediate region in a piezoelectric thin film resonator.
Figure 5B:
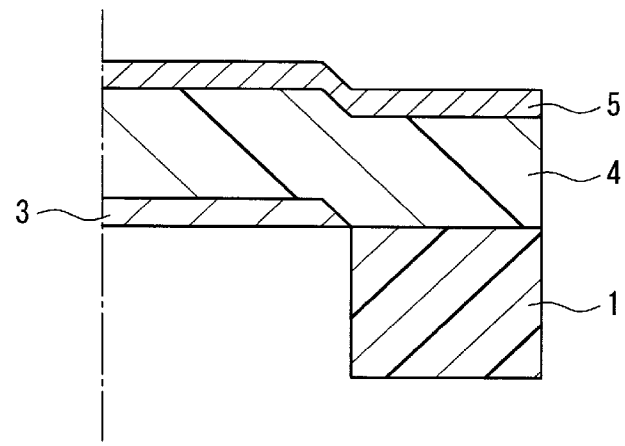
FIG. 5B is a cross sectional view of a principal portion of an intermediate region in a piezoelectric thin film resonator.
Figure 5C:
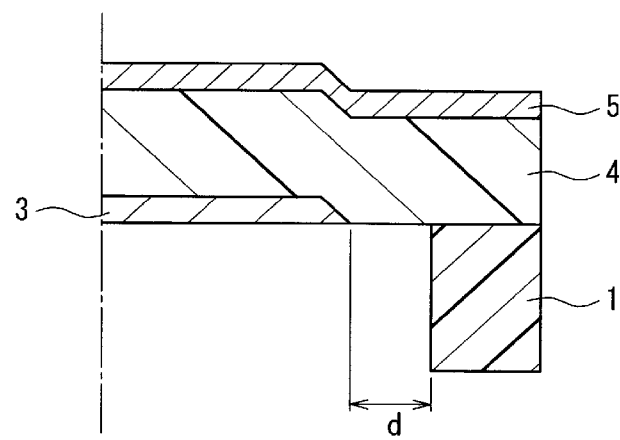
FIG. 5C is a cross sectional view of a principal portion of an intermediate region in a piezoelectric thin film resonator.

FIG. 4 shows the relationship between the distance d of the end 3a of the lower electrode 3 and the substrate 1 and the quality factor Q at the anti-resonance point in a piezoelectric thin film resonator in which the intermediate layer 7 is not formed. Specifically, FIG. 4 shows the results of calculating the influence of the distance d on the quality factor Qa at the anti-resonance point using the finite element method in the piezoelectric thin film resonator in which the intermediate layer 7 is not formed. FIG. 5A is a cross sectional view in which the distance d of the end 3a and the substrate 1 is d1. FIG. 5B is a cross sectional view in which the distance d of the end 3a and substrate 1 is 0. FIG. 5C is a cross sectional view in which the distance d of the end 3a and substrate 1 is d2. In FIG. 4, the quality factor Qa when the end 3a of the lower electrode 3 and the end of substrate 1 is overlapped (FIG. 5B) is plotted as d=0, the quality factor Qa when the lower electrode 3 and the substrate 1 are overlapped (FIG. 5A) is plotted as a range A, and the quality factor Qa when the lower electrode 3 and the substrate 1 are separated (FIG. 5C) is plotted as a range B.

As shown in the range B of FIG. 4, it is confirmed that unless the lower electrode 3 contacts the substrate 1, the quality factor Qa at the anti-resonance point transitions with an almost constant value irrespective of the distance from the end 3a of the lower electrode 3 to the substrate 1. In contrast, as shown in the range A of FIG. 4, it is confirmed that when the lower electrode 3 and the substrate 1 contact each other, the quality factor Qa sharply decreases, and the reduction in the quality factor Qa increases as the distance from the end 3a of the lower electrode 3 to the substrate 1, i.e., the width of the intermediate region 9, increases. This shows that, with the structure of Patent Document 3, the elastic energy, which dissipates to the substrate due to the contact between the substrate and the resonance region, cannot be ignored.

Figure 6:
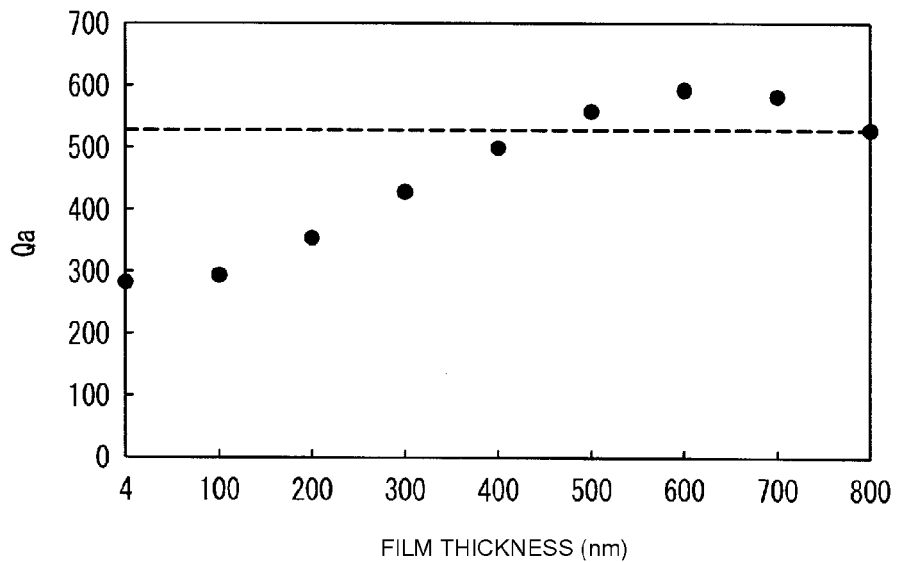
FIG. 6 is a characteristic chart showing the relationship between the film thickness of a silicon oxide film, and the quality factor Q.

FIG. 6 shows the results of calculating the influence of the thickness of a silicon oxide film on the quality factor Qa at the anti-resonance point using a model using the silicon oxide film as the intermediate layer 7 in the piezoelectric thin film resonator shown in FIG. 1. The width d of the intermediate region 9 in this case is 3 μm. In FIG. 6, the value shown by the dotted lines is the average value of the quality factor Qa in the range B of FIG. 4. As shown in FIG. 6, it is found that the quality factor Qa is improved by increasing the thickness of the silicon oxide film (intermediate layer 7), that the quality factor Qa has a peak at around 600 nm when the thickness of the silicon oxide film (intermediate layer 7) is increased, and that when the thickness is further increased, the quality factor Qa decreases. According to the results shown in FIG. 6, it is preferable to adjust the thickness of the silicon oxide film (intermediate layer 7) in the range of 450 nm to 800 nm in order to achieve the quality factor Qa higher than the quality factor Qa for the case of not forming the intermediate region 9.

With the structure described above, by adjusting the thickness of the silicon oxide film to be nearly ¼ of the wavelength at the anti-resonance point of the elastic wave spreading in the thickness direction in the silicon oxide film (intermediate layer 7), the elastic wave to leak to the substrate 1 is reflected in the intermediate layer 7, and thus the elastic wave can be confined in the resonance portion 8.

Here, when the stiffness in the thickness direction of the intermediate layer 7 is defined as C and the density is defined as ρ, the acoustic velocity v can be calculated based on the formula:

$$v = (C/\rho)^{1/2}.$$

Based on the acoustic velocity v calculated by the formula above and the frequency f, the thickness T1 of the intermediate layer 7 equivalent to the ¼ wavelength can be calculated based on the formula:

$$T1 = (\tfrac{1}{4}) \times (v/f).$$

When the end 3a of the fixed lower electrode 3 has an angle of α to the surface of the substrate 1, the thickness T2 of the intermediate layer 7 equivalent to the ¼ wavelength can be calculated based on the formula:

$$T2 = (\tfrac{1}{4}) \times (v/f) \cos \alpha.$$

(Table 1) shows the physical constants (Stiffness C, Density ρ) used for the calculation of the silicon oxide film, the aluminum nitride film, and the aluminum oxide film; the acoustic velocity v calculated from the physical constant; and the optimal thickness T1 and T2 of the intermediate layer 7 calculated from the physical constants. The frequency f used for the calculation of the acoustic velocity v and the thicknesses T1 and T2 of the intermediate layer 7 is 1.91 GHz.

TABLE 1

| Materials | C [$10^{12}$kg/S$^2$] | ρ [$10^3$kg/m$^2$] | V [m/s] | T1 [nm] (a = 90°) | T2 [nm] (a = 30°) |
|---|---|---|---|---|---|
| SiO$_2$ | 0.0788 | 2.20 | 5980 | 783 | 678 |
| AlN | 0.395 | 3.26 | 11000 | 1440 | 1250 |
| Al$_2$O$_3$ | 0.498 | 3.98 | 11200 | 1470 | 1270 |

The thickness of the silicon oxide film of 400 nm to 800 nm is equivalent to about 0.10 to 0.30 times the wavelength of the elastic wave which spreads in the thickness direction in the silicon oxide film at the anti-resonance point.

Figure 7:
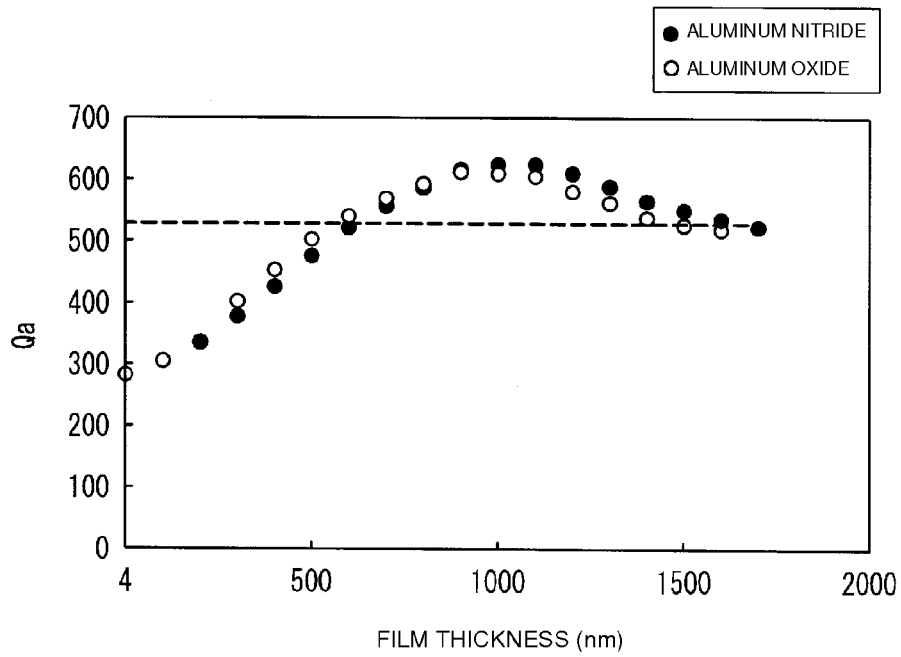
FIG. 7 is a characteristic chart showing the relationship between the film thickness of an aluminum oxide film or an aluminum nitride film and the quality factor Q.

FIG. 7 shows the results of calculating changes in the quality factor Qa relative to the film thickness of the intermediate layer 7 when an aluminum oxide film or an aluminum nitride film is used as the material for the intermediate layer 7. According to the results shown in FIG. 7, it is found that the quality factor Qa changes in the same manner as in the case where the intermediate layer 7 is formed of a silicon oxide film (FIG. 6). According to the results shown in FIG. 7, it is preferable to adjust the thickness of the intermediate layer 7 formed of an aluminum oxide film in the range of 570 to 1500 nm in order to achieve the quality factor Qa higher than the quality factor Qa for the case of not forming the intermediate region 9. When the intermediate layer 7 is formed of an aluminum nitride film, it is preferable to adjust the thickness of the intermediate layer 7 in the range of 600 nm to 1600 nm.

It is important for an insulator serving as the intermediate layer 7 to have a thickness equivalent to 0.10 to 0.30 times the wavelength at the anti-resonance point. When this condition is satisfied, the same effects can be obtained even when a structure other than the structures of the embodiments above is employed. For example, the intermediate layer 7 can be formed of any insulator, such as zinc oxide, tantalum oxide, or silicon nitride.

In the embodiments above, the intermediate layer 7 is a single layer. By laminating a plurality of insulating films having a thickness equivalent to 0.10 to 0.30 times the wavelength at the anti-resonance point, further effects can be obtained. In the structure in which the intermediate layer 7 is formed by laminating a plurality of insulating films, all the films constituting the intermediate layer 7 need not to be insulators and films other than the top layer contacting the lower electrode 3 may be formed of a metal film.

In the above, the via hole type piezoelectric thin film resonator is described as an embodiment. The same effects can be obtained also in a cavity type piezoelectric thin film resonator by providing the intermediate layer 7.

Figure 8:
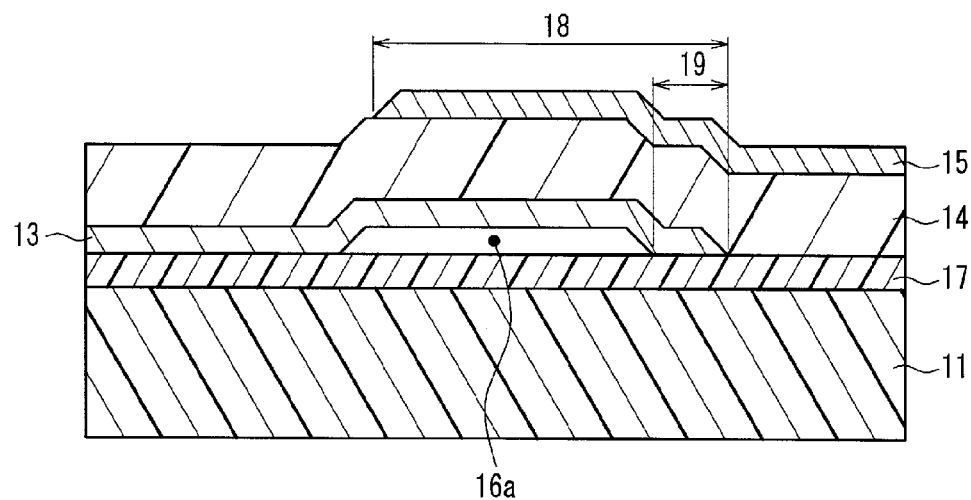
FIG. 8 is a cross sectional view showing the structure of a cavity type piezoelectric thin film resonator.
Figure 9:
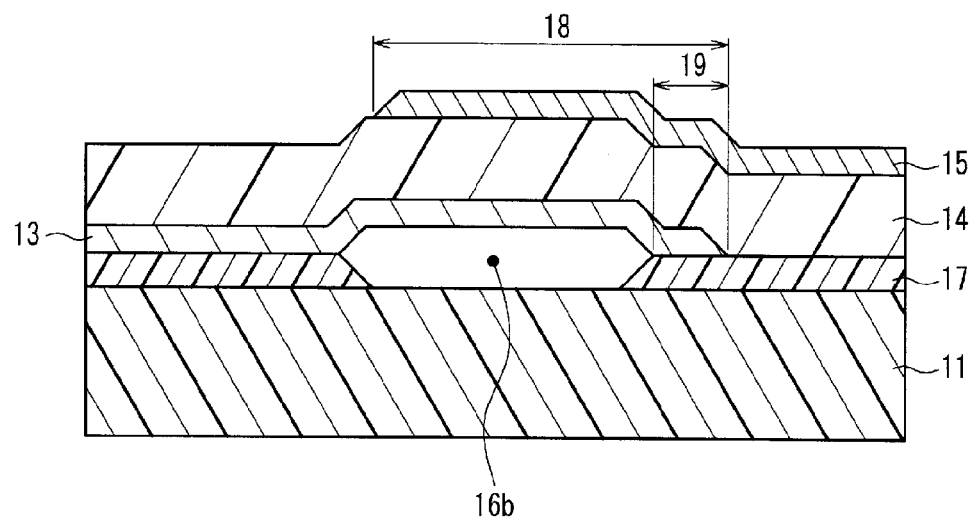
FIG. 9 is a cross sectional view showing the structure of a cavity type piezoelectric thin film resonator.
Figure 10:
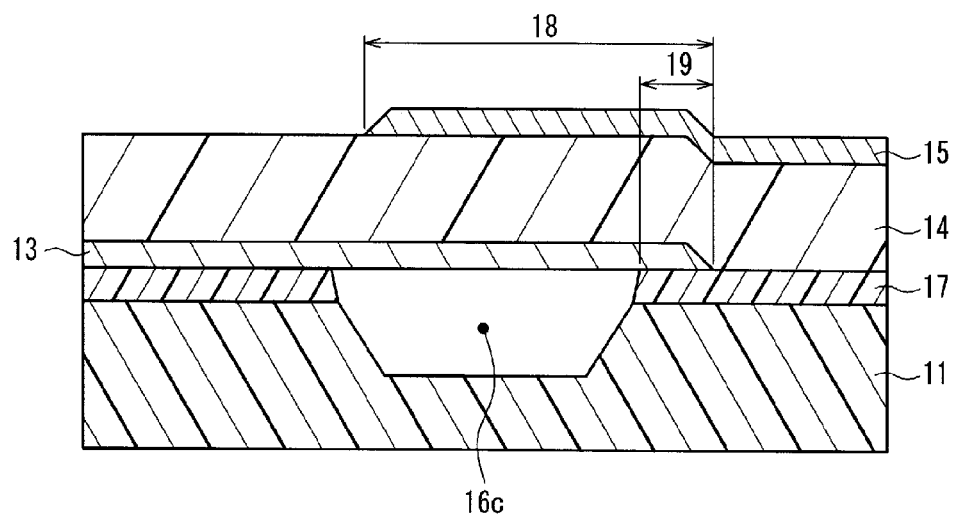
FIG. 10 is a cross sectional view showing the structure of a cavity type piezoelectric thin film resonator.

FIGS. 8 to 10 are cross sectional views of a thin film resonator when the structure of the present invention is applied to a cavity type piezoelectric thin film resonator. The cavity type piezoelectric thin film resonator shown in the figures has a substrate 11, a lower electrode 13, a piezoelectric film 14, an upper electrode 15, and an intermediate layer 17 similarly as in the via hole type piezoelectric thin film resonator. A region where the upper electrode 15, the lower electrode 13, and the piezoelectric film 14 are overlapped is a resonance portion 18 and a region where the lower electrode 13 and the intermediate layer 17 contact each other in the resonance portion 18 is an intermediate region 19. A space is formed under the lower electrode 13, and a space 16a shown in FIG. 8 is formed between the intermediate layer 17 and the lower electrode 13. A space 16b shown in FIG. 9 is formed between the substrate 11 and the lower electrode 13, in which the intermediate layer 17 is partially removed. The spaces 16a and 16b shown in FIGS. 8 and 9 are formed by forming a sacrificial layer on the intermediate layer 17, forming the lower electrode 13 on the sacrificial layer, and then removing the sacrificial layer when manufacturing a piezoelectric thin film resonator. Thus, the lower electrode 13 has a level difference generated at the edges of the spaces 16a and 16b. A space 16c shown in FIG. 10 is formed in the substrate 11 and the intermediate layer 17, and the lower electrode 13 is formed into a flat shape.

Figure 11:
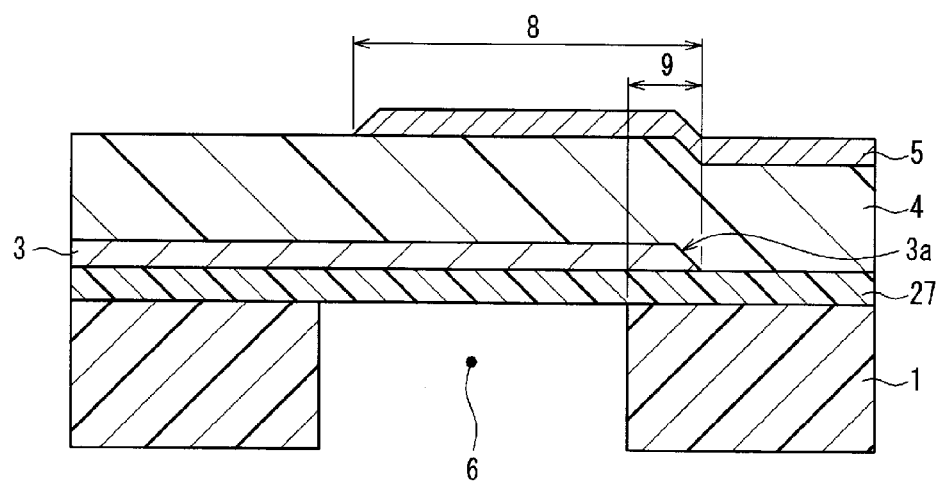
FIG. 11 is a cross sectional view showing the structure of a via hole type piezoelectric thin film resonator.

A piezoelectric thin film resonator shown in FIG. 11 has a structure in which an intermediate layer 27 formed of an insulating film covers the front surface of the resonance portion 8. The piezoelectric thin film resonator shown in FIG. 11 has almost the same structure as that of the piezoelectric thin film resonator shown in FIG. 1, and the same components are designated by the same reference numerals. When the intermediate layer 27 is formed of a silicon oxide film, the temperature compensation effect of the resonance properties can be obtained because the silicon oxide film has a temperature coefficient opposite to that of AlN or ZnO to be used as the piezoelectric film 4.

According to the structure disclosed in Japanese Unexamined Patent Application Publication No. 2005-236338, it is shown that favorable temperature properties are obtained by setting the film thickness ratio of AlN which is a piezoelectric film and $SiO_2$ which is a temperature compensation film to 0.1 to 0.5. Also in the structure shown in FIG. 11, the end 3a of the lower electrode 3 is fixed to the substrate 1 through the intermediate layer 27 in the same manner as in the structures shown in FIGS. 1, 8, 9, and 10, and thus the effect of improving the Q value described above can be obtained.

However, when the front surface of the resonance portion 8 is covered with the intermediate layer 27, considerable degradation of the electromechanical coupling coefficient occurs. When the intermediate layer 27 is formed of $SiO_2$, an increase in dissipation also occurs because the mechanical Q value of the silicon oxide film is generally low.

2. Method for Manufacturing Piezoelectric Thin Film Resonator

[2-1. Method for Manufacturing Cavity Type Piezoelectric Thin Film Resonator]

FIGS. 12A to 12F show processes for manufacturing the cavity type piezoelectric thin film resonator shown in FIG. 8. In the piezoelectric thin film resonator shown in FIG. 8, an Si substrate cut at the (100) plane was used as the substrate 11. For the substrate 11, a quartz substrate or the like may be used in place of the Si substrate. The piezoelectric film 14 was formed of AlN. The upper electrode 15 was formed of a Ru film.

Figure 12A:
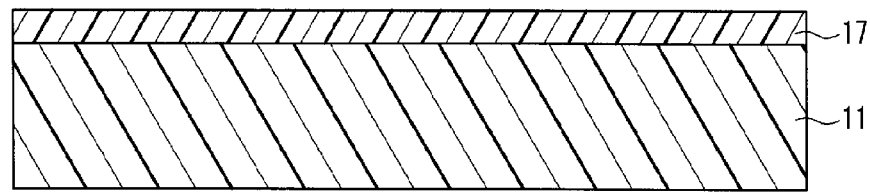
FIG. 12A is a cross sectional view showing a process for manufacturing a cavity type piezoelectric thin film resonator.

First, as shown in FIG. 12A, the intermediate layer 17 made by a silicon oxide film is formed on the substrate 11. The intermediate layer 17 can be formed by a PECVD (Plasma Enhanced Chemical Vapor Deposition) method or a thermal oxidation method.

Figure 12B:
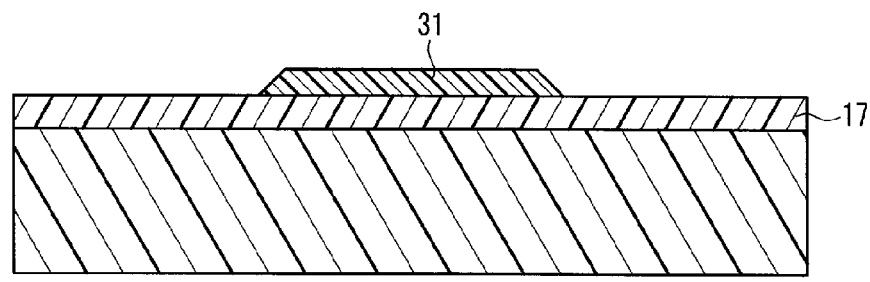
FIG. 12B is a cross sectional view showing a process for manufacturing the cavity type piezoelectric thin film resonator.

Next, as shown in FIG. 12B, materials serving as a sacrificial layer 31 are formed into a film on the intermediate layer 17, and then the film is patterned by photolithography treatment and etching treatment. In this case, the pattern of the sacrificial layer 31 is smaller than a region where the upper electrode 15 and the lower electrode 13 will be overlapped. Since the sacrificial layer 31 is eventually removed, any material can be chosen insofar as the material can chemically easily be removed. For example, the sacrificial layer 31 can be formed of resist, polyimide, polysilicon, PSG (Phospho Silicate Glass), metal film, or the like.

Figure 12C:
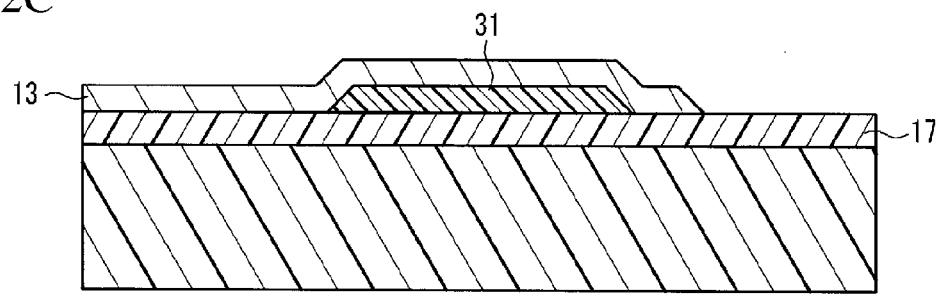
FIG. 12C is a cross sectional view showing a process for manufacturing the cavity type piezoelectric thin film resonator.

Next, as shown in FIG. 12C, the lower electrode 13 is formed on the intermediate layer 17 and the sacrificial layer 31. The lower electrode 13 is a laminated film and is formed by sputtering in an argon (Ar) gas atmosphere under a pressure of 0.6 to 1.2 Pa. Furthermore, the lower electrode 13 is patterned into a desired shape by photolithography treatment and etching treatment.

Figure 12D:
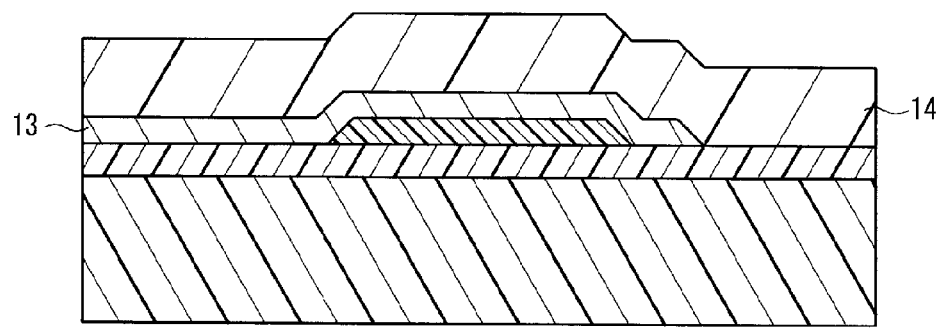
FIG. 12D is a cross sectional view showing a process for manufacturing the cavity type piezoelectric thin film resonator.

Next, as shown in FIG. 12D, the piezoelectric film 14 is formed on the lower electrode 13 and the substrate 11. The piezoelectric film 14 can be formed of AlN. In this embodiment, sputtering film formation is carried out using an Al target in an $Ar/N_2$ mixed gas atmosphere having a pressure of about 0.3 Pa.

Figure 12E:
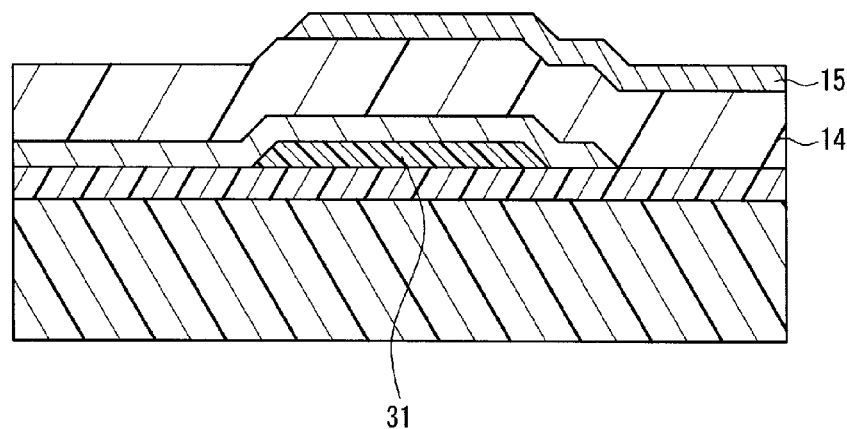
FIG. 12E is a cross sectional view showing a process for manufacturing the cavity type piezoelectric thin film resonator.

Next, as shown in FIG. 12E, the upper electrode 15 is formed on the piezoelectric film 14. The upper electrode 15 is formed of a Ru film and is formed by sputtering in an Ar gas atmosphere having a pressure of 0.6 to 1.2 Pa. The piezoelectric film 14 and the upper electrode 15 each are processed using wet etching treatment and dry etching treatment.

Figure 12F:
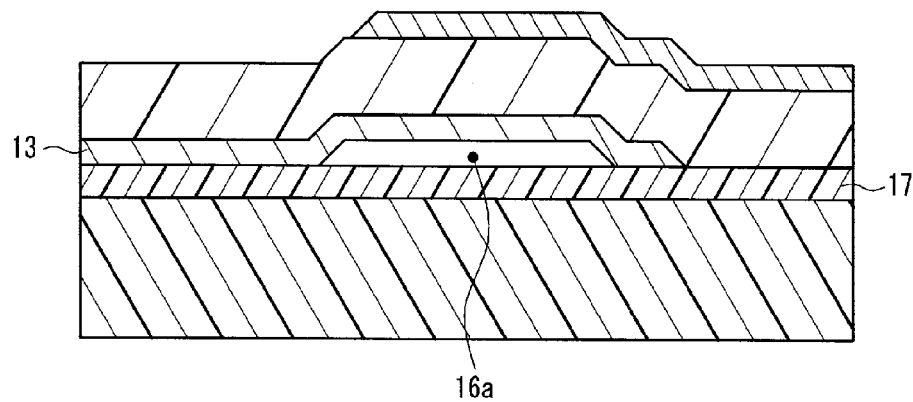
FIG. 12F is a cross sectional view showing a process for manufacturing the cavity type piezoelectric thin film resonator.

Finally, as shown in FIG. 12F, the space 16a can be formed by removing the sacrificial layer 31. Thus, a cavity type piezoelectric thin film resonator is completed.

In this embodiment, the intermediate layer 17 is not processed, but the intermediate layer 17 other than the region where the upper electrode 15 and the lower electrode 13 are overlapped may be removed because the electrical properties and the mechanical properties are not affected.

[2-2. Method for Manufacturing Via Hole Type Piezoelectric Thin Film Resonator]

FIGS. 13A to 13F show processes for manufacturing the via hole type piezoelectric thin film resonator shown in FIGS. 1 and 2. In the piezoelectric thin film resonator shown in FIGS. 1 and 2, an Si substrate cut at the (111) plane is used as the substrate 1. For the substrate 1, a quartz substrate or the like may be used in place of the Si substrate. The lower electrode 3 was formed of a Ru layer. The piezoelectric film 4 was formed of AlN. The upper electrode 5 was formed of a Ru film.

Figure 13A:
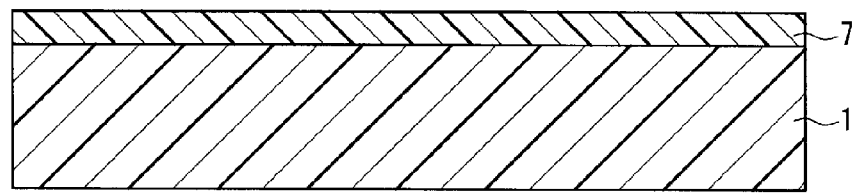
FIG. 13A is a cross sectional view showing a process for manufacturing a via hole type piezoelectric thin film resonator.

First, as shown in FIG. 13A, the intermediate layer 7 made by a silicon oxide film is formed on the substrate 1. The intermediate layer 7 can be formed by a PECVD method or a thermal oxidation method.

Figure 13B:
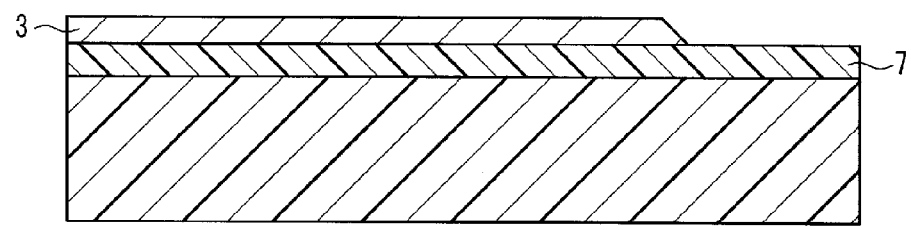
FIG. 13B is a cross sectional view showing a process for manufacturing the via hole type piezoelectric thin film resonator.

Next, as shown in FIG. 13B, the lower electrode 3 is formed on the intermediate layer 7. The lower electrode 3 is a laminated film and is formed by sputtering in an Ar gas atmosphere under a pressure of 0.6 to 1.2 Pa. Furthermore, the lower electrode 3 is patterned into a desired shape by photolithography treatment and etching treatment.

Figure 13C:
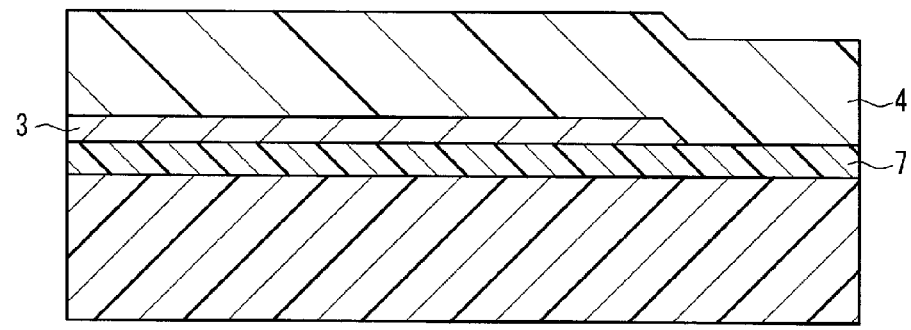
FIG. 13C is a cross sectional view showing a process for manufacturing the via hole type piezoelectric thin film resonator.

Next, as shown in FIG. 13C, the piezoelectric film 4 is formed on the lower electrode 3 and the intermediate layer 7. The piezoelectric film 4 can be formed by sputtering AlN using an Al target in an $Ar/N_2$ mixed gas atmosphere having a pressure of about 0.3 Pa.

Figure 13D:
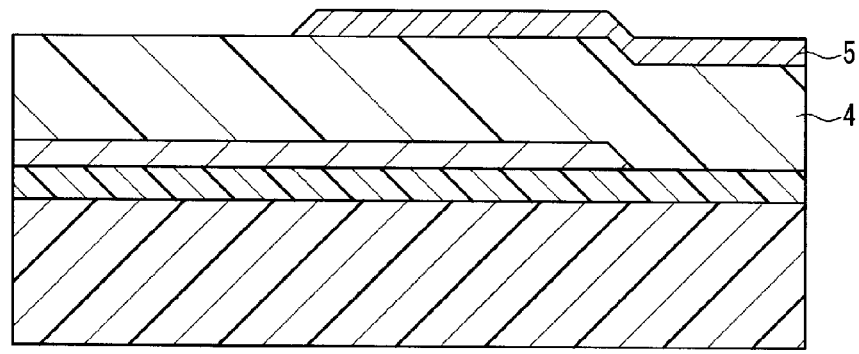
FIG. 13D is a cross sectional view showing a process for manufacturing the via hole type piezoelectric thin film resonator.

Next, as shown in FIG. 13D, the upper electrode 5 is formed on the piezoelectric film 4. The upper electrode 5 can be formed by sputtering a Ru film in an Ar gas atmosphere having a pressure of 0.6 to 1.2 Pa. Next, the piezoelectric film 4 and the upper electrode 5 each are processed using wet etching treatment and dry etching treatment.

Figure 13E:
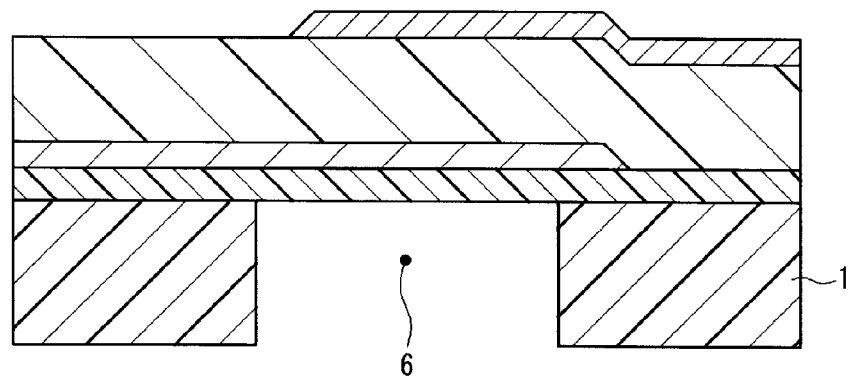
FIG. 13E is a cross sectional view showing a process for manufacturing the via hole type piezoelectric thin film resonator.

Next, as shown in FIG. 13E, dry etching treatment is carried out from the back surface of the substrate 1 to form the space 6 (via hole).

Figure 13F:
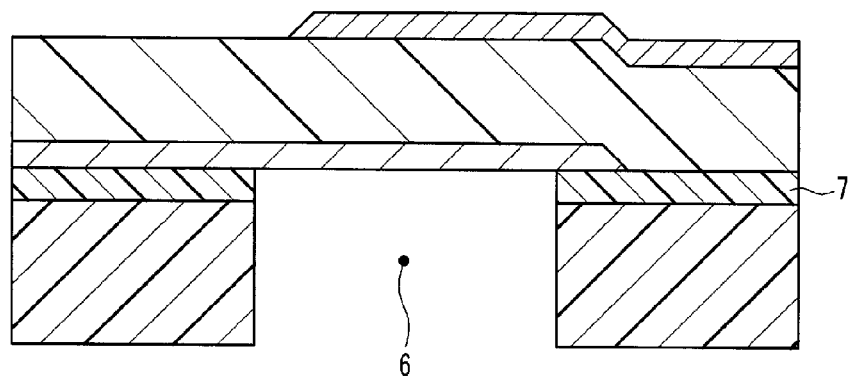
FIG. 13F is a cross sectional view showing a process for manufacturing the via hole type piezoelectric thin film resonator.

Finally, as shown in FIG. 13F, the intermediate layer 7 (silicon oxide film) in the resonance region is removed by wet etching treatment. Thus, a via hole type piezoelectric thin film resonator is completed.

The intermediate layer 7 other than the region where the upper electrode 5 and the lower electrode 3 are overlapped may be removed because the electrical properties and the mechanical properties are not affected.

In the above, the embodiments of the piezoelectric thin film resonator of the present invention are described in detail but the present invention is not limited to a specific embodiment and can be variously modified or altered in the scope of the present invention as defined in the claims.

3. Structure of Duplexer Having Filter

A duplexer is mounted on mobile communications (high frequency wireless communications), such as cellular phone terminals, PHS (Personal Handy-phone System) terminals, or wireless LAN systems. The duplexer has a transmitting function and a receiving function, such as communication radio waves, and is used in wireless devices in which the frequencies of a transmission signal and a receiving signal are different from each other.

Figure 14:
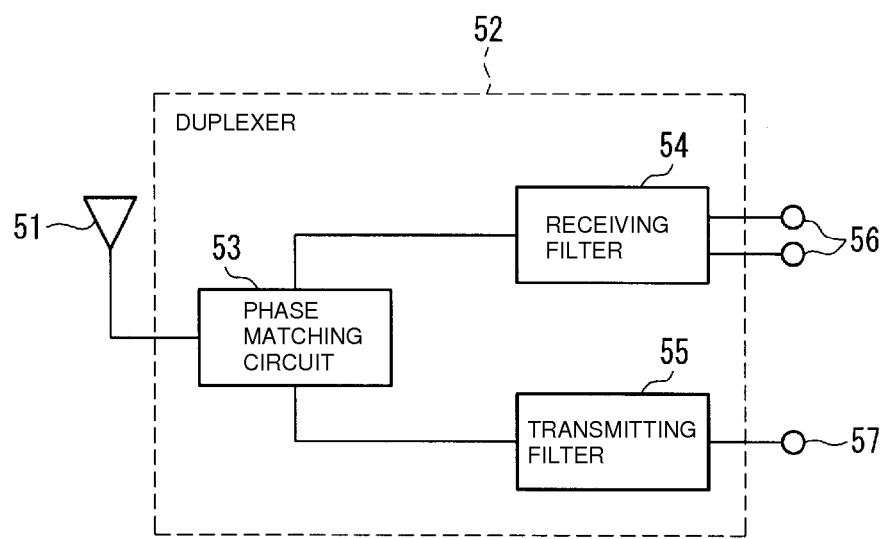
FIG. 14 is a block diagram showing the structure of a duplexer having a filter of this embodiment.

FIG. 14 shows the structure of a duplexer having the filter of this embodiment. A duplexer 52 has a phase matching circuit 53, a receiving filter 54, and a transmitting filter 55. The phase matching circuit 53 is an element for adjusting the phase of an impedance of the receiving filter 54 in order to prevent a transmitting signal output from the transmitting filter 55 from entering the receiving filter 54 side. Moreover, to the phase matching circuit 53, an antenna 51 is connected. The receiving filter 54 contains a band pass filter that passes only a signal having a predetermined frequency band among receiving signals input through the antenna 51. To the receiving filter 54, an output terminal 56 is connected. The transmitting filter 55 contains a band pass filter that passes only a signal having a predetermined frequency band among transmitting signals input through an input terminal 57. The input terminal 57 is connected to the transmitting filter 55. Here, the receiving filter 54 and the transmitting filter 55 contain the piezoelectric thin film resonator of the embodiment(s) of the present invention. Each of the receiving filter 54 and the transmitting filter 55 is an example of the filter of the present invention.

As described above, by providing the piezoelectric thin film resonator according to embodiment(s) of the present invention to the receiving filter 54 and the transmitting filter 55, the dissipation of the vibrational energy from the resonance portion can be suppressed, and a reduction in the quality factor of the resonator is prevented.

4. Structure of Communication Module

Figure 15:
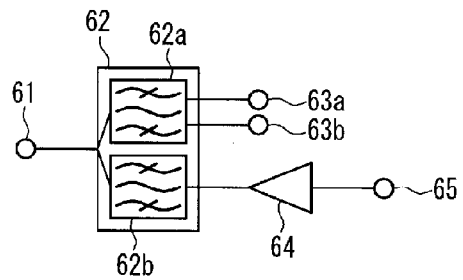
FIG. 15 is a block diagram showing the structure of a communication module of this embodiment.

FIG. 15 shows an example of a communication module having the piezoelectric thin film resonator of the embodiment(s) of the present invention or the above-described duplexer. As shown in FIG. 15, a duplexer 62 has a receiving filter 62a and a transmitting filter 62b. To the receiving filter 62a, receiving terminals 63a and 63b corresponding to a balance output are connected, for example. The transmitting filter 62b is connected to a transmission terminal 65 through a power amplifier 64. Here, the receiving filter 62a and the transmitting filter 62b contain the piezoelectric thin film resonator of the embodiment(s) of the present invention.

When receiving operation is performed, the receiving filter 62a passes only a signal having a predetermined frequency band among the receiving signals input through an antenna terminal 61, and then outputs the signal to the outside from the receiving terminals 63a and 63b. When transmitting operation is performed, the transmitting filter 62b passes only a signal having a predetermined frequency band among transmitting signals, which are input from a transmission terminal 65 and amplified with the power amplifier 64, and then outputs the signal to the outside from the antenna terminal 61.

As described above, by providing the piezoelectric thin film resonator or the duplexer of the embodiment(s) of the present invention to the receiving filter 62a and the transmitting filter 62b of a communication module, the dissipation of the vibrational energy from the resonance portion can be suppressed, and a reduction in the quality factor of the resonator is prevented.

The structure of the communication module shown in FIG. 15 is an example, and the same effects are obtained even when the piezoelectric thin film resonator of the present invention is mounted on communication modules of other aspects.

5. Structure of Communication Apparatus

Figure 16:
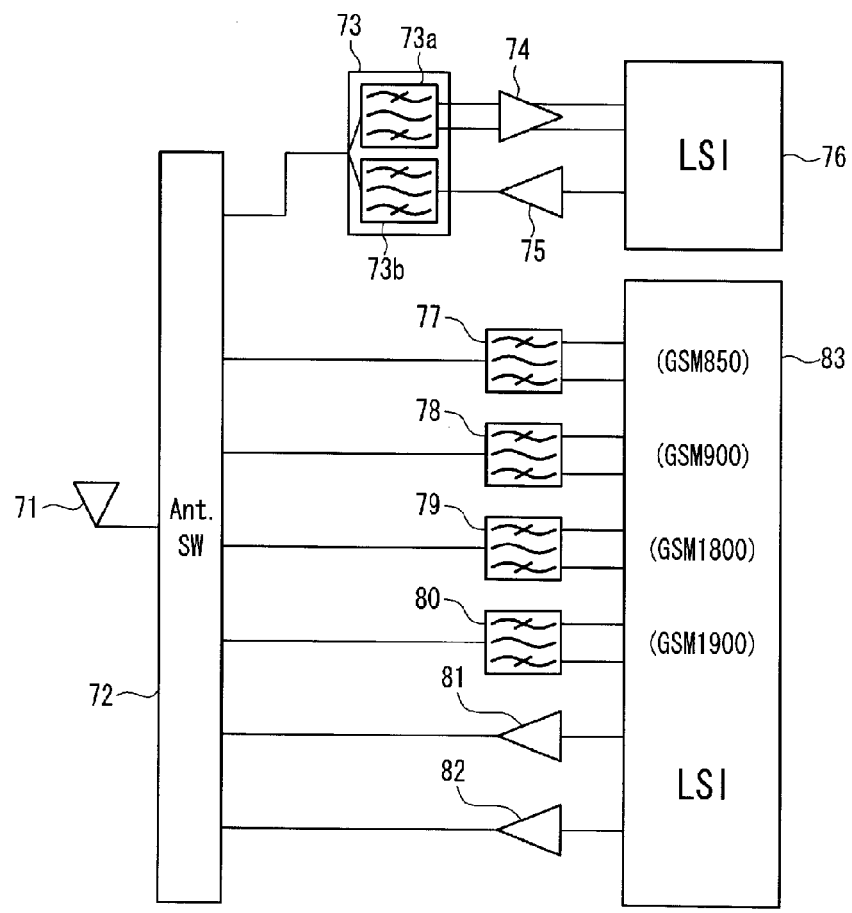
FIG. 16 is a block diagram showing the structure of a communication apparatus of this embodiment.
Figure 17:
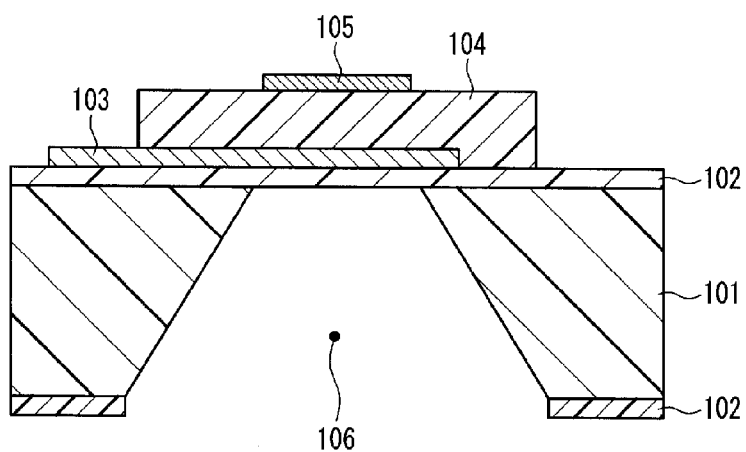
FIG. 17 is a cross sectional view showing the structure of a resonator disclosed in Non-patent Document 1.
Figure 18:
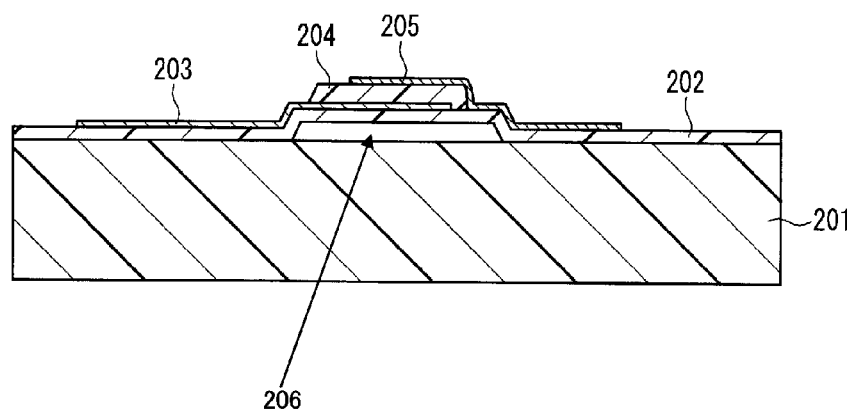
FIG. 18 is a cross sectional view showing the structure of a resonator disclosed in Patent Document 1.
Figure 19:
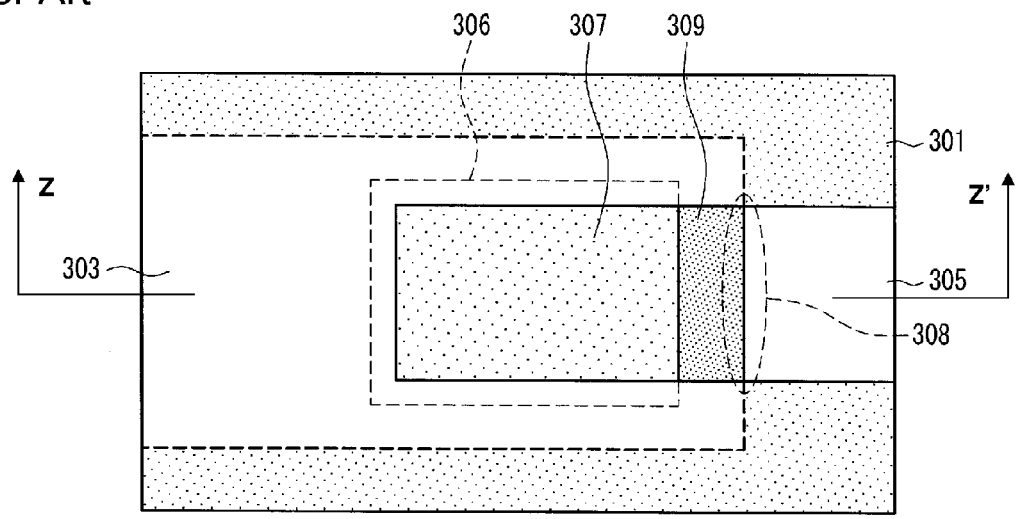
FIG. 19 is a plan view showing the structure of a resonator disclosed in Patent Document 3.
Figure 20:
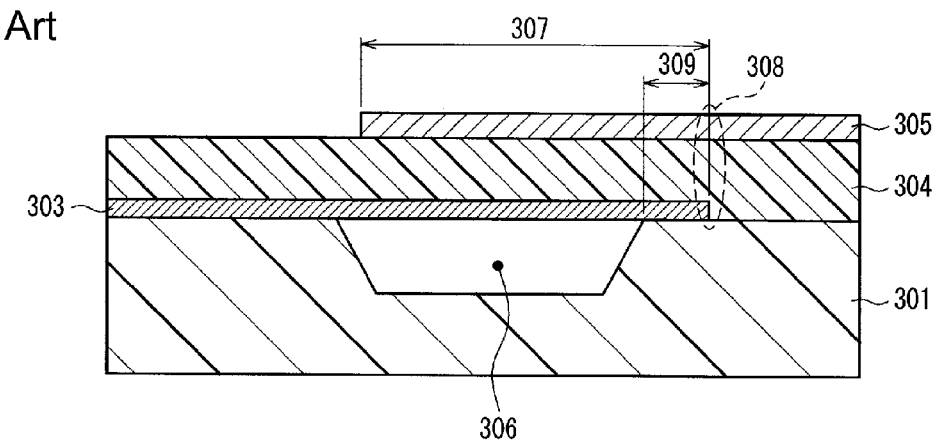
FIG. 20 is a cross sectional view showing the structure of a resonator disclosed in Patent Document 3.

FIG. 16 shows an RF block of a cellular phone terminal as an example of a communication apparatus having the communication module of the embodiment(s) of the present invention. The structure shown in FIG. 16 is the structure of a cellular phone terminal corresponding to a GSM (Global System for Mobile Communications) communication method and a W-CDMA (Wideband Code Division Multiple Access) communication method. The GSM communication method in this embodiment corresponds to the 850 MHz band, 950 MHz band, 1.8 GHz band, and 1.9 GHz band. The cellular phone terminal has a microphone, a speaker, a liquid crystal display, and the like in addition to the structure shown in FIG. 16. However, because these components are not needed in the description of this embodiment, they are not shown. Here, receiving filters 73a, 77, 78, 79, and 80 and a transmitting filter 73b contain the filter(s) according to embodiment(s) of the present invention.

First, an LSI to be operated is selected by an antenna switch circuit 72 based on the communication method of the receiving signal inputted through the antenna 71, W-CDMA or GSM. When the input receiving signal corresponds to the W-CDMA communication method, it is switched so that the receiving signal is output to a duplexer 73. The receiving signal inputted into the duplexer 73 is regulated to a predetermined frequency band by the receiving filter 73a, and then a balanced type receiving signal is output to a LNA 74. The LNA 74 amplifies the input receiving signal, and then outputs the same to an LSI 76. The LSI 76 performs demodulation to an audio signal based on the input receiving signal and controls the operations of respective portions of the cellular phone terminal.

On the other hand, when a signal is to be transmitted, the LSI 76 generates a transmitting signal. The generated transmitting signal is amplified by the power amplifier 75 inputted into the transmitting filter 73b. The transmitting filter 73b passes only a signal having a predetermined frequency band among transmitting signals inputted thereto. The transmitting signal outputted from the transmitting filter 73b is output to the exterior from the antenna 71 through the antenna switch circuit 72.

When the input receiving signal is a signal corresponding to the GSM communication method, the antenna switch circuit 72 selects one of the receiving filters 77 to 80 according to the frequency band, and then outputs a receiving signal thereto. The receiving signal that has been band-regulated by the one of the receiving filters 77 to 80 is input into an LSI 83. The LSI 83 performs demodulation to an audio signal based on the input receiving signal, and controls the operations of respective components of the cellular phone terminal. On the other hand, when a signal is to be transmitted, the LSI 83 generates a transmitting signal. The generated transmitting signal is amplified by a power amplifier 81 or 82 to be output to the exterior from the antenna 71 through the antenna switch circuit 72.

By providing the communication module of this embodiment to the communication apparatus as described above, the dissipation of the vibrational energy from the resonance portion can be suppressed, and a reduction in the quality factor of the resonator is prevented.

6. Effects and the Like of this Embodiment

According to the embodiment(s) of the present invention, the dissipation of the vibrational energy from the resonance portion can be suppressed, and a reduction in the quality factor of the resonator is prevented. According to the embodiments, a piezoelectric thin film resonator that can suppress the dissipation of the vibrational energy from the resonance portion can be manufactured with a simple manufacturing process.

The intermediate layer 7 can be formed of silicon oxide. By structuring as described above, a piezoelectric thin film resonator having excellent resonance properties can be provided. In particular, by setting the thickness of the silicon oxide film to be 0.40 to 0.70 times the thickness of the piezoelectric film 4, a piezoelectric thin film resonator having excellent resonance properties can be provided.

By using an aluminum oxide film as the insulator for the intermediate layer 7, a piezoelectric thin film resonator having excellent resonance properties can be provided. In particular, by setting the thickness of the aluminum oxide film to be 0.50 to 1.30 times the thickness of the piezoelectric film 4, a piezoelectric thin film resonator having excellent resonance properties can be provided.

By using an aluminum nitride film as the insulator for the intermediate layer 7, a piezoelectric thin film resonator having excellent resonance properties can be provided. In particular, by setting the thickness of the aluminum nitride film to be 0.50 to 1.40 times the thickness of the piezoelectric film 4, a piezoelectric thin film resonator having excellent resonance properties can be provided.

The piezoelectric film 4 can be formed of aluminum nitride or zinc oxide having orientation properties in which the (002) direction is the principal axis. According to this structure, a piezoelectric thin film resonator having excellent resonance properties can be provided.

By providing the piezoelectric thin film resonator of the embodiment(s) of the present invention to a filter, a communication module, and a communication apparatus, the dissipation of the vibrational energy from the resonance portion can be suppressed using a simple manufacturing process. Therefore, high-performance filters, communication modules, and communication apparatus can be provided.

INDUSTRIAL APPLICABILITY

The piezoelectric thin film resonator, the filter, the communication module, and the communication apparatus of the present invention are useful for apparatuses capable of receiving or transmitting signals having a predetermined frequency (ies).

The invention claimed is:

1. A piezoelectric thin film resonator, comprising:
   a substrate,
   an intermediate layer disposed on the substrate and formed of an insulator,
   a lower electrode disposed on the intermediate layer,
   a piezoelectric film disposed on the lower electrode, and
   an upper electrode disposed at a portion facing the lower electrode with the piezoelectric film interposed therebetween,
   wherein in a resonance region where the lower electrode and the upper electrode face each other, a space is provided below the lower electrode so as to promote piezoelectric resonance,
   wherein the resonance region and a region of the space cross each other,
   wherein in the resonance region, all or part of an intermediate region that is a region of the resonance region excluding the region of the space is fixed to the intermediate layer, and
   wherein the thickness of the intermediate layer is 0.10 to 0.30 times a wavelength of an elastic wave which spreads in a thickness direction in the intermediate layer at an anti-resonance frequency of the piezoelectric thin film resonator.

2. The piezoelectric thin film resonator according to claim 1, wherein the intermediate layer is formed of silicon oxide.

3. The piezoelectric thin film resonator according to claim 1, wherein the piezoelectric film is formed of aluminum nitride or zinc oxide having orientation properties in which the (002) direction is the principal axis.

4. A filter, comprising the piezoelectric thin film resonator according to claim 1.

5. A communication module, comprising the filter according to claim 4.

6. A communication apparatus, comprising the communication module according to claim 5.

7. The piezoelectric thin film resonator according to claim 1, wherein the space is formed in the substrate and the intermediate layer, or between the lower electrode and the intermediate layer.

8. The piezoelectric thin film resonator according to claim 1, wherein the space is formed between the lower electrode and the intermediate layer, and the intermediate layer is formed into a flat shape.

9. The piezoelectric thin film resonator according to claim 1, wherein the space is defined by a bottom surface of the lower electrode, a void in the intermediate layer, and an upper surface of the substrate.

10. The piezoelectric thin film resonator according to claim 1, wherein the space is defined by a bottom surface of the lower electrode and a void thereunder, the void penetrating the intermediate layer and the substrate, and not reaching a bottom surface of the substrate.

11. The piezoelectric thin film resonator according to claim 1, wherein the space is formed in the substrate under the intermediate layer.

* * * * *